(12) United States Patent
Cheng

(10) Patent No.: US 8,932,901 B2
(45) Date of Patent: Jan. 13, 2015

(54) STRESSED PHASE CHANGE MATERIALS

(75) Inventor: Huai-Yu Cheng, White Plains, NY (US)

(73) Assignee: Macronix International Co., Ltd., Hsinchu (TW)

( * ) Notice: Subject to any disclaimer, the term of this patent is extended or adjusted under 35 U.S.C. 154(b) by 282 days.

(21) Appl. No.: 13/450,935

(22) Filed: Apr. 19, 2012

(65) Prior Publication Data

US 2013/0105759 A1     May 2, 2013

Related U.S. Application Data

(60) Provisional application No. 61/553,743, filed on Oct. 31, 2011.

(51) Int. Cl.
*H01L 21/06* (2006.01)
*H01L 45/00* (2006.01)

(52) U.S. Cl.
CPC ............ *H01L 45/06* (2013.01); *H01L 45/1226* (2013.01); *H01L 45/1233* (2013.01); *H01L 45/144* (2013.01); *H01L 45/1608* (2013.01)
USPC ......................... 438/102; 257/5; 257/E47.001

(58) Field of Classification Search
None
See application file for complete search history.

(56) References Cited

U.S. PATENT DOCUMENTS

| | | | |
|---|---|---|---|
| 4,177,475 A | 12/1979 | Holmberg | |
| 5,596,522 A | 1/1997 | Ovshinsky et al. | |
| 5,825,046 A | 10/1998 | Czubatyj et al. | |
| 6,087,674 A | 7/2000 | Ovshinsky et al. | |
| 6,088,269 A | 7/2000 | Lambertson | |
| 6,143,636 A | 11/2000 | Forbes et al. | |
| 6,586,761 B2 | 7/2003 | Lowrey | |
| 6,956,261 B2 | 10/2005 | Shibata | |
| 7,355,238 B2 | 4/2008 | Takata et al. | |
| 7,453,081 B2 | 11/2008 | Happ et al. | |
| 7,679,163 B2 | 3/2010 | Chen et al. | |
| 7,745,807 B2 | 6/2010 | Chen et al. | |
| 7,759,770 B2 | 7/2010 | Happ et al. | |
| 7,800,159 B2 | 9/2010 | Widjaja et al. | |
| 7,800,943 B2 | 9/2010 | Ravasio et al. | |

(Continued)

OTHER PUBLICATIONS

R.E Simpson, et al., "Toward the Ultimate Limit of Phase Change in Ge2Sb2Te5," Amer. Chem. Soc., Nano Lett. vol. 10, 2010, pp. 414-419.

(Continued)

*Primary Examiner* — Sonya D McCall Shepard
(74) *Attorney, Agent, or Firm* — James F. Hann; Haynes Beffel & Wolfeld LLP

(57) ABSTRACT

A memory device includes a substrate and a memory array on the substrate. The memory array includes memory cells including stressed phase change materials in a layer of encapsulation materials. The memory cells may include memory cell structures such as mushroom-type memory cell structures, bridge-type memory cell structures, active-in-via type memory cell structures, and pore-type memory cell structures. The stressed phase change materials may comprise GST ($Ge_xSb_xTe_x$) materials in general and $Ge_2Sb_2Te_5$ in particular. To manufacture the memory device, a substrate is first fabricated. Memory cells including phase change materials in a layer of encapsulation materials are formed on a front side of the substrate. A tensile or compressive stress is induced into the phase change materials on the front side of the substrate.

14 Claims, 9 Drawing Sheets

(56) References Cited

U.S. PATENT DOCUMENTS

| | | |
|---|---|---|
| 7,867,880 B2 | 1/2011 | Park et al. |
| 7,875,873 B2 | 1/2011 | Chen et al. |
| 7,893,419 B2 | 2/2011 | Hudgens et al. |
| 7,893,420 B2 | 2/2011 | Liang et al. |
| 7,913,215 B2 | 3/2011 | Chou et al. |
| 8,143,611 B2 | 3/2012 | Choi et al. |
| 8,192,592 B2 | 6/2012 | Kim et al. |
| 2004/0109351 A1 | 6/2004 | Morimoto et al. |
| 2006/0049447 A1 | 3/2006 | Lee et al. |
| 2006/0118853 A1 | 6/2006 | Takata et al. |
| 2006/0126423 A1 | 6/2006 | Aratani et al. |
| 2007/0029606 A1 | 2/2007 | Noh et al. |
| 2007/0097739 A1 | 5/2007 | Happ et al. |
| 2007/0249086 A1* | 10/2007 | Philipp et al. .......... 438/95 |
| 2007/0249116 A1 | 10/2007 | Philipp et al. |
| 2007/0267620 A1 | 11/2007 | Happ |
| 2007/0267721 A1 | 11/2007 | Kuh et al. |
| 2008/0017842 A1 | 1/2008 | Happ et al. |
| 2008/0035907 A1 | 2/2008 | Czubatyj et al. |
| 2009/0014704 A1 | 1/2009 | Chen et al. |
| 2009/0078924 A1 | 3/2009 | Liang et al. |
| 2009/0168505 A1 | 7/2009 | Hanzawa et al. |
| 2009/0230378 A1 | 9/2009 | Ryoo et al. |
| 2010/0044665 A1 | 2/2010 | Jedema |
| 2010/0328996 A1 | 12/2010 | Shih et al. |
| 2011/0049456 A1 | 3/2011 | Lung et al. |
| 2011/0140066 A1 | 6/2011 | Liang et al. |

OTHER PUBLICATIONS

W.K. Njoroge et al., "Density changes upon crystallization of $Ge_2Sb_{2.04}Te_{4.74}$ films," J. Vac. Sci. Technol. A 20, 230 (2002), 4pp.

Kojima R. et al., "Acceleration of Crystallization Speed by Sn Addition to Ge—Sb—Te Phase-Change Recording Material," Jpn. J. Appl. Phys. vol. 40:5930-5937, 2001.

* cited by examiner

Crystallization

Recrystallization

STRESSED PHASE CHANGE MATERIALS

RELATED APPLICATIONS

This application claims benefit of U.S. Provisional Patent Application No. 61/553,743 filed on 31 Oct. 2011.

BACKGROUND OF THE INVENTION

1, Field of the Invention

The present invention relates to memory devices including phase change memory materials with induced stress, and methods for manufacturing such devices.

2, Description of Related Art

In a phase change memory array including memory cells, each memory cell includes a phase change memory element. The phase change memory element is made of phase change materials that exhibit a large resistivity contrast between crystalline (low resistivity) and amorphous (high resistivity) states. Phase change materials may include alloys of materials such as germanium (Ge), antimony (Sb), tellurium (Te), gallium (Ga), indium (In), silver (Ag), selenium (Se), thallium (Ti), bismuth (Bi), tin (Sn), copper (Cu), palladium (Pd), lead (Pb), sulfur (S), and gold (Au). Phase change materials include $Ge_xSb_xTe_x$ materials in general and $Ge_2Sb_2Te_5$ materials in particular.

$Ge_2Sb_2Te_5$ materials exhibit an amorphous phase and two crystalline phases over a range of temperatures. The first crystalline phase is the rock salt phase or the face centered cubic (fcc) phase. The second crystalline phase is the hexagonal phase. The fcc and hexagonal phases are formed when the temperature of the as-deposited amorphous material is increased to approximately 150° C. and 300° C., respectively (W. K. Njoroge et al., J. Vac. Sci. Technol. A, 20, 230 (2002)). The hexagonal phase is characterized by a higher density than the rock salt phase in the phase change materials, indicating that additional film shrinkage (2~3%) would rise after high temperature (about 400° C.) back-end of line process (BEOL). The hexagonal phase transition would lead to grain-size variations and voids in the interface, resulting in a low yield and causing a reliability issue. Therefore the hexagonal phase formation is not desirable.

It is desirable to provide memory devices that inhibit the hexagonal formation in phase change materials, and methods for manufacturing such memory devices.

SUMMARY

A memory device includes a substrate and a memory array on the substrate. The memory array includes memory cells including stressed phase change materials in a layer of encapsulation materials. The memory cells may include memory cell structures such as a mushroom-type memory cell structure, a bridge-type memory cell structure, an active-in-via type memory cell structure, and a pore-type memory cell structure.

To manufacture a memory device including stressed phase change materials, a stress can be applied to a substrate, such as a semiconductor wafer. Integrated circuit die with memory cells including phase change materials in a layer of encapsulation materials can be formed on a front side of the stressed substrate. The stress on the substrate can be released, inducing a selected one of tensile or compressive stress into the phase change materials.

Other aspects and advantages of the present invention can be seen on review of the drawings, the detailed description and the claims, which follow.

DETAILED DESCRIPTION

A detailed description of embodiments of stressed phase change memory is provided with reference to the FIGS. 1-7. Preferred embodiments are described to illustrate the present technology, not to limit its scope, which is defined by the claims. Those of ordinary skill in the art will recognize a variety of equivalent variations on the description that follows.

A memory device having memory cells including phase change materials under stress is described. The stress can inhibit transformations between crystalline forms that have different volumes, such as a transformation from the rock salt form to the hexagonal form in $Ge_2Sb_2Te_5$, and other phase change materials. Methods for manufacturing such memory devices including inducing stress into phase change materials are described.

The memory cells may include, but are not limited to, a mushroom-type memory cell structure, a bridge-type memory cell structure, an active-in-via type memory cell structure, and a pore-type memory cell structure. Those memory structures are further described below.

The stressed phase change materials may comprise GST ($Ge_xSb_xTe_x$) materials. The GST materials may include $Ge_2Sb_2Te_5$. The GST materials may have a thickness less than 30 nanometers, a thickness less than or equal to about 10 nanometers, or a thickness less than or equal to about 2.5 nanometers, where the term "about" encompasses a range around the intended thickness, 2.5 nanometers in this case, that accommodates manufacturing variations and limits of metrology in forming a layer of material having the intended thickness. The stressed phase change materials may have induced tensile stress or compressive stress.

Description of methods for manufacturing embodiments of the memory device including a memory array including memory cells including stressed phase change materials is provided below.

Figure 1A:
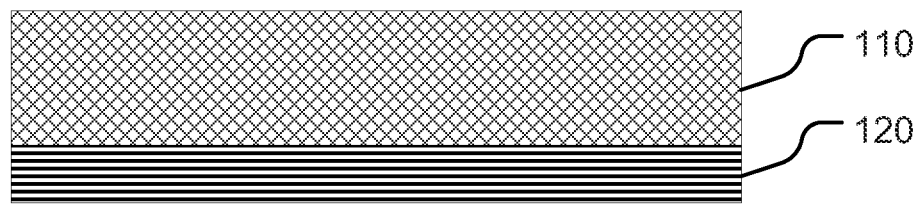
FIGS. 1A-1C illustrate a process of applying compressive stress to GST materials.
Figure 1B:
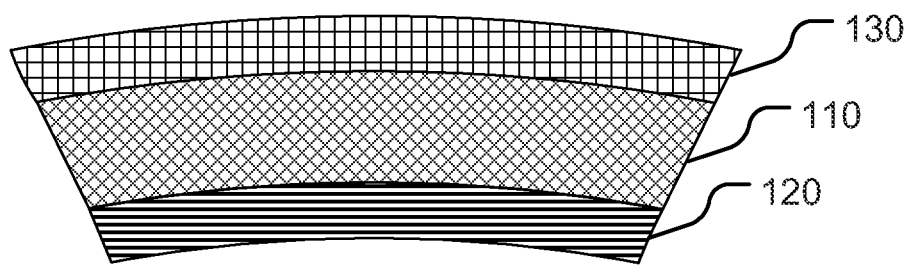
Figure 1C:
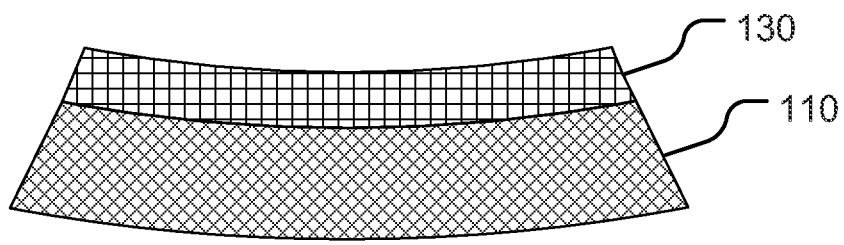

FIGS. 1A through 1C illustrate stages in a first embodiment of a process to manufacture the memory device with compressive stress induced into phase change materials. In reference to FIG. 1A, a substrate 110 is first provided. The substrate 110 may be for example a silicon wafer having a thickness on the order of hundreds of microns, such as 725 microns, for example. A stress layer 120 is then deposited on a back side of the substrate 110 and applies compressive stress on the substrate 110. The stress layer 120 may include a tungsten layer. The stress in the stress layer 120 may cause the substrate 110 to bend.

A method to determine the stress (σ) in a thin film after deposition of the thin film on a substrate is by measuring the substrate curvature using the Stoney's equation. The Stoney's equation describes the relationship between the stress (σ) in a thin film such as the stress layer 120 and a plate-like substrate such as the substrate 110:

$$\sigma_f = \frac{1}{6} \frac{M_s d_s^2}{d_f} \left( \frac{1}{R_1} - \frac{1}{R_0} \right)$$

$$M_s = \frac{E_s}{1 - v_s}$$

wherein $E_s$ is the Young's modulus of the substrate, $v_s$ is Poisson's ratio for the substrate, $M_s$, is the biaxil modulus of the substrate, $d_s$ is the substrate thickness, and $d_f$ is the thin film thickness. $R_0$ and $R_1$ are the radii of curvature of the substrate before and after the thin film deposition on the substrate, respectively.

When a plate-like substrate is bent by the stress in the thin film, it forms an arc with a radius. The curvature of the bent substrate is the reciprocal of the radius. The Stoney's equation calculates the stress in the thin film using the term $(1/R_1-1/R_0)$, which is the difference between the curvatures before and after the deposition of the thin film on the substrate. If the difference is negative, then the stress (σ) in the thin film is compressive. If the difference is positive, then the stress (σ) in the thin film is tensile.

The thicker the substrate, the harder it is for the thin film to bend it. If the bending has caused a certain curvature difference $(1/R_1-1/R_0)$, then the Stoney's equation determines that the thin film must have applied a greater stress for a thicker substrate than for a thinner substrate. In fact, the stress (σ) in the thin film is proportional to the square of the substrate thickness $(d_s)$.

The thickness of the thin film deposited on the back side of the substrate may vary. For example, a first thin film with a thickness $d_{f1}$ or a second thin film with a thickness $d_{f2}$ may be deposited on the back side of the same substrate, where $d_{f1}$ may be equal to, less than or greater than $d_{f2}$. A thicker thin film may cause a greater curvature difference $(1/R_1-1/R_0)$ on the substrate but may not necessarily result in a greater stress (σ) than a thinner thin film with the same materials. This is because the increase in curvature difference is achieved at a greater cost in terms of the thickness of the thin film. The Stoney's equation takes this cost into consideration by scaling down the stress (σ) with the thickness $(d_f)$ of the thin film. On the other hand, if $d_{f1}$ is less than $d_{f2}$ and the first and second thin films have caused the same curvature difference $(1/R_1-1/R_0)$ on the same substrate, then the Stoney's equation determines that the first thin film with a less thickness must have applied a greater stress (σ) on the substrate than the second thin film with a greater thickness. A thinner film may apply a greater stress because it is made of different materials or because it is deposited on the substrate with a different process.

Sputtering is a common process for thin film deposition. Given the same thin film in terms of materials and thickness, the stress (σ) is a function of sputtering pressure. For example, the stress layer 120 may be deposited by sputtering at 2.5 mTorr sputtering pressure to induce a 1.9 GPa compressive stress on the back side of the substrate 110. The substrate 110 may have a thickness of approximately 725 microns $(d_s)$ while the stress layer 120 may have a thickness approximately ranging between 145 nanometers and 175 nanometers $(d_f)$.

Whether the stress type is compressive or tensile is caused by the sputtering pressure and determined by the sign of the term $(1/R_1-1/R_0)$ in the Stoney's equation. Applying appropriate sputtering pressure can selectively induce desirable types and magnitudes of stress into the substrate and consequently the GST materials.

In reference to FIG. 1B, in a memory cell layer 130, memory cells including phase change materials in a layer of encapsulation materials are formed on a front side of the substrate 110, which is bowed under the compressive stress induced by the stress layer 120 on the back side. The memory cell layer 130 may include a plurality of bit lines extending in parallel in a first direction and in electrical communication with a bit line decoder. A plurality of word lines extend in parallel in a second direction and are in electrical communication with a word line decoder/driver.

Memory cells in the memory cell layer 130 may be formed at the intersections of bit lines and word lines. Each of the memory cells in the memory cell layer 130 is coupled to an access device, such a diode or a transistor, arranged in electrical series between a bit line in the plurality of bit lines, and a word line in the plurality of word lines. Typically, a memory cell may include a bottom electrode coupled, a memory element, and a top electrode connected. The bottom electrode is coupled to the access device. The top electrode is coupled to the bit line. The memory element is coupled to the bottom electrode and the top electrode in series. These access devices may be formed below the memory cell layer 130 that includes the phase change memory cells, or after, as suits a desired implementation.

A memory element in a memory cell in the memory cell layer 130 may include GST ($Ge_xSb_xTe_x$) materials. The GST materials may include $Ge_2Sb_2Te_5$. The GST materials may have a thickness less than 30 nanometers, less than or equal to about 10 nanometers, or less than or equal to about 2.5 nanometers. Effects of the thickness are explained below in connection with descriptions about experiments in accordance with the present invention. The memory element may be electrically coupled to and in physical contact with encapsulation materials adjacent to the memory element. The encapsulation materials may include TiN, $SiO_2$, SiN, $Al_2O_3$, W, or multiple layer combinations of such materials.

Memory cells in the memory cell layer 130 may include memory cell structures such as a mushroom-type memory cell structure, a bridge-type memory cell structure, an active-in-via type memory cell structure, and a pore-type memory cell structure. Those memory structures may include the GST materials and encapsulation materials as described above and are further described below in connection with FIGS. 3-6.

The memory cell layer 130 as described above, including a plurality of word lines, a plurality of bit lines, access devices, and memory cells, may be formed on the front side of the substrate 110 before a stress layer 120 is removed from the back side of the substrate 110, as described below in reference to FIG. 1C. Alternatively, portions of the memory cell layer 130, such as the plurality of bit lines, may be formed after the stress layer 120 is removed from the back side of the substrate 110. If memory cells in the memory cell layer 130 and corresponding access devices are arranged in electrical series such that each memory cell is coupled to a bit line in the plurality of bit lines, and each access device is coupled to a word line in the plurality of word lines, then access devices may be also be formed over the memory cell layer 130 after the stress layer 120 is removed from the back side of the substrate 110.

In reference to FIG. 1C, the stress layer 120 is removed from the back side of the substrate 110. In embodiments in which the stress layer 120 comprises tungsten for example, the stress layer 120 may be removed with an etching process using an $H_2O_2$ etchant. Consequently, the stress that has been applied by the stress layer 120 on the substrate 110 is removed and a corresponding stress is induced in the phase change materials in the memory cell layer 130 formed on the front side of the substrate 110. In FIG. 1C, the stress induced in the phase change materials in the memory cell layer 130 is compressive stress.

Figure 2A:
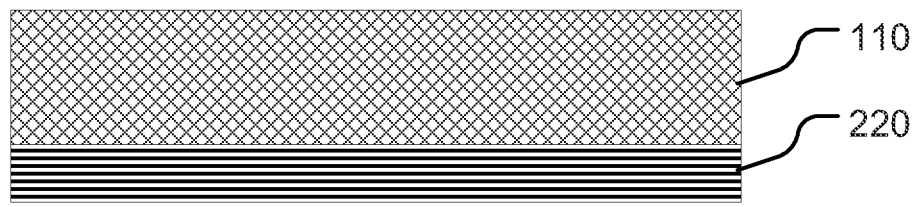
FIGS. 2A-2C illustrate a process of applying tensile stress to GST materials.
Figure 2B:
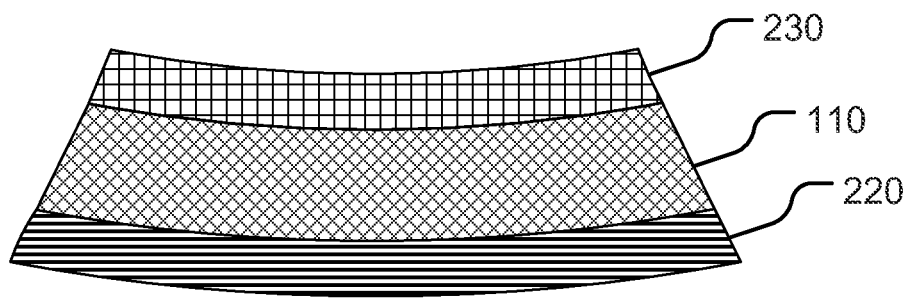
Figure 2C:
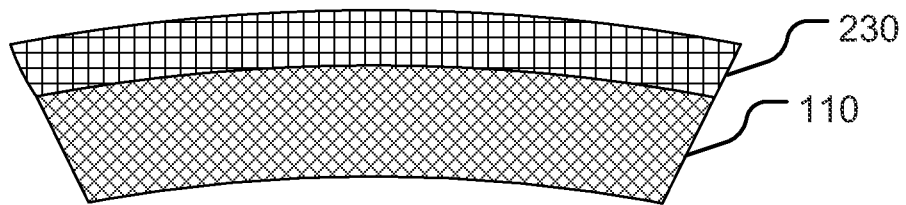

FIGS. 2A through 2C illustrate stages in a second embodiment of a process to manufacture the memory device, where tensile stress is induced into phase change materials. In reference to FIG. 2A, the substrate 110 is first provided as in FIG. 1A, where the substrate 110 may comprise a semiconductor wafer or other structure. A stress layer 220 is then deposited on a back side of the substrate 110 and applies tensile stress on the substrate 110. The stress layer 220 may include a tungsten layer. The internal stress in the stress layer 220 may cause the substrate 110 to bend. For example, the stress layer 220 may be deposited by sputtering at 23 mTorr sputtering pressure to induce a 790 MPa tensile stress on the back side of the substrate 110.

Descriptions about the Stoney's equation in reference to FIG. 1A are generally applicable to FIG. 2A.

In reference to FIG. 2B, in a memory cell layer 230, memory cells including phase change materials in a layer of encapsulation materials are formed on a front side of the substrate 110. Descriptions about the memory cell layer 130 in reference to FIG. 1B are generally applicable to the memory cell layer 230 in reference to FIG. 2B. In particular, the memory cell layer 230 can include a variety of combinations of word lines, bit lines, access devices, and memory cells. Memory cells may be formed at the intersections of bit lines and word lines in electrical series with access devices in the memory cell layer 230. A memory element in a memory cell in the memory cell layer 230 may include GST ($Ge_xSb_x$-$Te_x$) materials. The GST materials may include $Ge_2Sb_2Te_5$.

The memory cell layer 230 as described above may be formed on the front side of the substrate 110 before a stress layer 220 is removed from the back side of the substrate 110, as described below in reference to FIG. 2C. Alternatively, portions of the memory cell layer 230, such as the plurality of bit lines, may be formed after the stress layer 220 is removed from the back side of the substrate 110. If memory cells in the memory cell layer 230 and corresponding access devices are arranged in electrical series such that each memory cell is coupled to a bit line in the plurality of bit lines, and each access device is coupled to a word line in the plurality of word lines, then access devices may be also be formed in the memory cell layer 230 after the stress layer 220 is removed from the back side of the substrate 110.

In reference to FIG. 2C, the stress layer 220 is removed from the back side of the substrate 110. Where the stress layer 220 comprises tungsten, it may be removed with an etching process using an $H_2O_2$ etchant. Consequently, the stress that has been applied by the stress layer 220 on the substrate 110 is removed and a corresponding stress is induced in the phase change materials in the memory cell layer 230 formed on the front side of the substrate 110. In FIG. 2C, the stress induced in the phase change materials in the memory cell layer 230 is tensile stress.

In reference to FIGS. 1A through 1C and 2A through 2C, a method is described to induce stress into phase change materials by first depositing a stress layer on the back side of the substrate and then removing the stress layer when a memory cell layer is formed on a front side of the substrate. However, other methods may be used to induce stress into phase change materials. For example, external mechanical stress may be applied to a substrate after formation of memory cells. Encapsulation layers may also be deposited adjacent to phase change materials to induce stress into the layer of phase change materials.

Experiments performed with embodiments of the stress induced phase change materials demonstrate that the induced stress can inhibit formation of the hexagonal form (HCC form) in phase change materials, as a function of the magnitude and sign (compressive or tensile) of the stress, and of the thickness of the layer of phase change material being stressed. For GST ($Ge_xSb_xTe_x$) materials with a thickness of 30 nanometers, experiments were performed for two stress conditions: without any induced stress and with induced tensile stress. Without any induced stress, a crystallization transition temperature (Tx) of 169° C. was observed in which the rock salt, or fcc, crystalline form dominates. A transition from rock salt to hexagonal crystalline form occurred at a temperature ($T_{fcc\text{-}hex}$) of about 373 ° C. By applying 790 MPa tensile stress through W layer on the backside, the crystallization transition temperature (Tx) was observed at 163° C., close to the Tx for unstressed GST. A transition from rock salt to hexagonal crystalline form occurred at a temperature ($T_{fcc\text{-}hex}$) of about 403° C., which is substantially higher than that of unstressed GST but still resulted in formation of the undesired hexagonal phase at temperatures often encountered in semiconductor manufacturing environment. Results show that, with the thickness of 30 nanometers for the GST materials, under the temperature conditions, hexagonal phase is formed with or without any induced stress. For compressive stress conditions with 30 nm of GST, the ($T_{fcc\text{-}hex}$) also remains within the range of expected temperature encountered during manufacture.

For GST ($Ge_xSb_xTe_x$) materials with a thickness of 10 nanometers, experiments are repeated for three stress conditions: without any induced stress, with induced tensile stress, and with induced compressive stress. Typically, the stress that is induced into GST layers on the front side of the silicon substrate is less than the stress that is applied on the backside of the silicon substrate by a tungsten (W) layer. Given the same stress applied on the backside, the thinner the GST layers, the higher the stress that the GST layers can feel because the stress induced into the GST layers depends on the thickness of the GST layers and the relaxation of the silicon substrate after the removal of the tungsten layer. For example, the stress of 1.9 GPa is first applied by depositing tungsten (W) layers on the backside of the substrate. The tungsten (W) layer is later removed and the resultant stress that is induced into the GST layers depends on the GST thickness. For GST layers with a thickness of 30 nm, the induced stress through the 1.9 GPa W layer on the backside may be around 500 MPa. But for GST layers with a thickness of 10 nm, the same 1.9 GPa stress applied by the W layer may induce a stress of about 1 GPa on the GST layers. Results show that, with the thickness of 10 nanometers for the GST materials, without any induced stress, a crystallization transition temperature (Tx) of about 160° C. was observed in which the rock salt, or fcc, crystalline form dominates. A transition from rock salt to hexagonal crystalline form occurred at a temperature ($T_{fcc\text{-}hex}$) of about 350° C. With the thickness of 10 nanometers for the GST materials, with induced tensile stress from a 790 MPa W layer on the backside of the substrate, a crystallization transition temperature (Tx) of about 160° C. was observed in which the rock salt, or fcc, crystalline form dominates. A transition from rock salt to hexagonal crystalline form occurred at a temperature ($T_{fcc\text{-}hex}$) of about 360° C.

However, with the thickness of 10 nanometers for the GST materials, with induced compressive stress at about 1.9 GPa, a crystallization transition temperature (Tx) of about 160° C. was observed in which the rock salt, or fcc, crystalline form dominates. A transition from rock salt to hexagonal crystalline form did not occur at temperatures tested below 450° C. Thus, a memory cell can be formed in which the GST materials are less than 10 nm thick under compressive stress, in which the transition from rock salt to hexagonal crystalline form can be avoided at temperatures typically encountered during manufacturing.

The thickness of less than or equal to about 10 nanometers for GST materials described herein suggests that similar thickness with induced compressive stress, would be desirable for other memory materials prone to more than one crystalline form to inhibit undesirable changes in the volume of the materials.

For GST ($Ge_xSb_xTe_x$) materials with a thickness of 2.5 nanometers, experiments are repeated for three stress conditions: without any induced stress, with induced tensile stress, and with induced compressive stress. Results show that, with the thickness of 2.5 nanometers for the GST materials, without any induced stress a crystallization transition temperature (Tx) of about 160° C. was observed in which the rock salt, or fcc, crystalline form dominates. A transition from rock salt to hexagonal crystalline form occurred at a temperature ($T_{fcc\text{-}hex}$) of about 350° C. With the thickness of 2.5 nanometers for the GST materials, with induced tensile stress from a 790 MPa W layer on the backside of the substrate, a crystallization transition temperature (Tx) of about 160° C. was observed in which the rock salt, or fcc, crystalline form dominates. A transition from rock salt to hexagonal crystalline form did not occur below 450° C.

Likewise, with the thickness of 2.5 nanometers for the GST materials, with induced compressive stress from a 1.9 GPa W layer on the backside of the substrate, a crystallization transition temperature (Tx) of about 160° C. was observed in which the rock salt, or fcc, crystalline form dominates. A transition from rock salt to hexagonal crystalline form did not occur at temperatures tested below 450° C. Thus, a memory cell can be formed in which the GST materials are less than 12.5 nm thick under compressive stress or under tensile stress, in which the transition from rock salt to hexagonal crystalline form can be avoided at temperatures typically encountered during manufacturing.

Accordingly, the induced tensile stress and the induced compressive stress both inhibit the hexagonal phase formation when the GST film thickness is less than or equal to about 2.5 nanometers. The thickness of less than or equal to about 2.5 nanometers for GST materials described herein suggests that similar thickness would be desirable for other memory materials prone to more than one crystalline phases to inhibit undesirable phases with induced tensile stress and induced compressive stress.

The experiments described above suggest that when the thickness of phase change materials is less than 30 nanometers, inducing stress into phase change materials may inhibit formation of undesirable crystalline phases such as hexagonal phase at high temperatures.

Memory cells in the memory device may include memory cell structures such as mushroom-type memory cell structures, bridge-type memory cell structures, active-in-via-type memory cell structures, and pore-type memory cell structures. Each memory cell structure may be implemented with stressed GST materials. If a layer of stressed GST materials in a memory cell structure is thinner than 10 nm, then the stress effect will be more significant than if thicker than 10 nm. For example, a bridge-type memory cell structure with a layer of stressed GST materials thinner than 10 nm is more likely to inhibit the hexagonal phase formation than if the layer of stressed GST materials is thicker than 10 nm. With scaling down of phase change memory devices, more types of memory cell structures may have layers of stressed GST materials thinner than 10 nm and can benefit from the present technology.

Figure 3A:
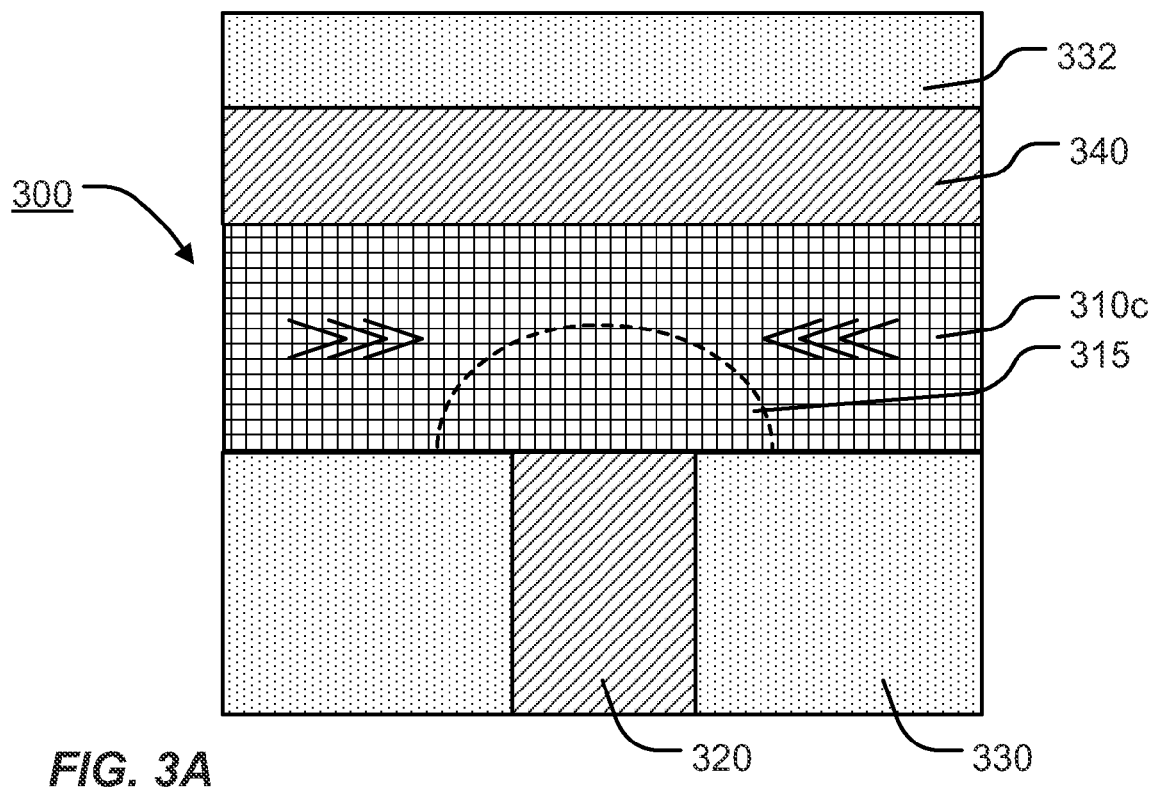
FIGS. 3A-3B illustrate a cross-sectional view of a mushroom-type memory cell structure including stressed GST materials.
Figure 3B:
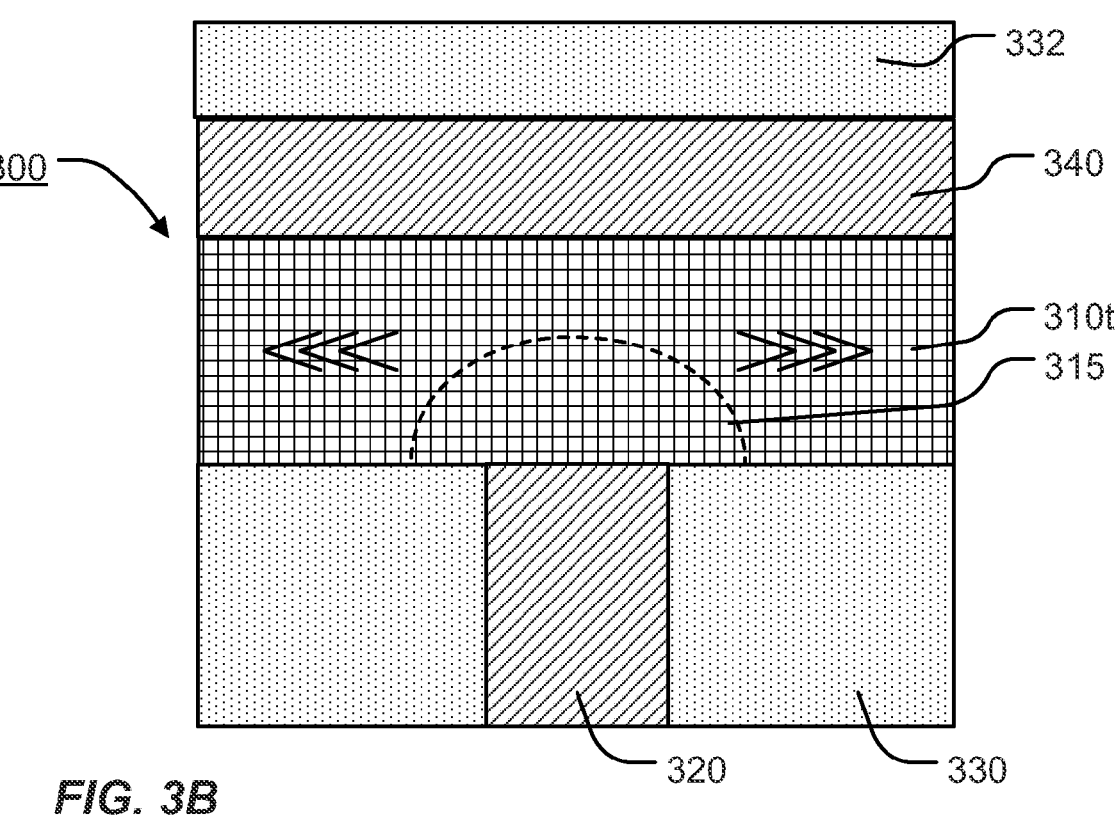

FIGS. 3A and 3B illustrate a cross-sectional view of a mushroom-type memory cell structure including GST materials with induced compressive stress or tensile stress, respectively. Memory cell 300 has a bottom electrode 320 which extends through a dielectric layer 330 from underlying access structures. In FIG. 3A, a top electrode 340 is formed on top of a memory element 310c with induced compressive stress, as indicated by ">>> <<<". Encapsulation materials 332 surround the memory material. In FIG. 3B, a top electrode 340 is formed on top of a memory element 310t with induced tensile stress, as indicated by "<<< >>>". The memory element 310c or 310t may be electrically coupled to and in physical contact with encapsulation materials 332 adjacent to the memory element 310c or 310t, The encapsulation materials 332 may include, for example dielectric materials like $SiO_2$, $Si_3N_4$, $SiO_xN_y$, or $Al_2O_3$, and/or conductive materials like TiN or W or combinations of these and other materials. The active region 315 occurs in the memory element 310c and 310t, In operation, as current passes between the bottom electrode 320 and the top electrode 340 and through the memory element 310c or 310t, the active region 315 heats up more quickly than the remainder of the memory element 310c or 310t.

Figure 4A:
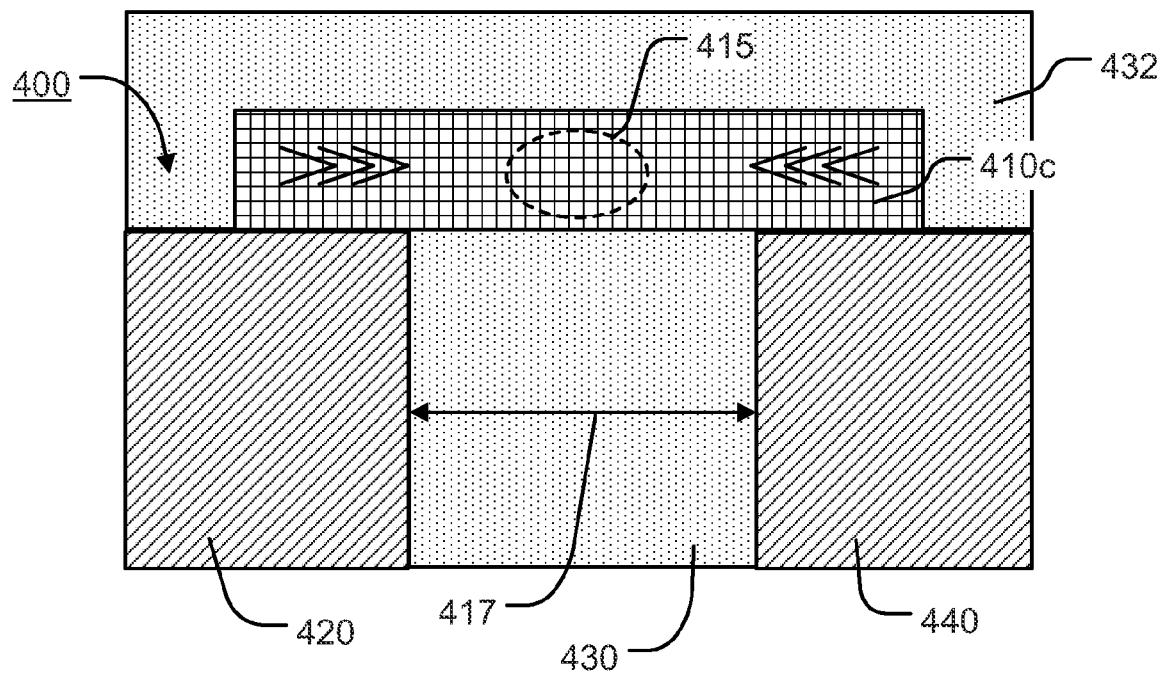
FIGS. 4A-4B illustrate a cross-sectional view of a bridge-type memory cell structure including stressed GST materials.
Figure 4B:
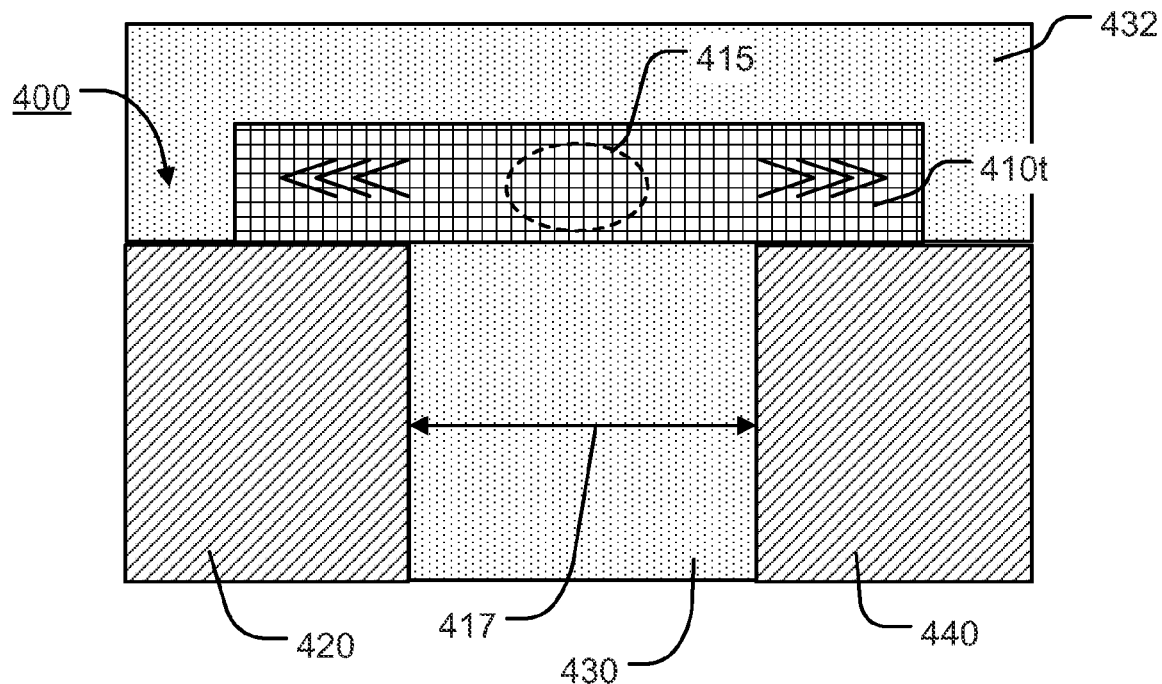

FIGS. 4A and 4B illustrate a cross-sectional view of a bridge-type memory cell structure including GST materials with induced compressive stress or tensile stress, respectively. Memory cell 400 includes a dielectric spacer 430 separating first and second electrodes 420 and 440. Encapsulation materials 432 surround the memory material. In FIG. 4A and FIG. 4B, a memory element (410c and 410t, respectively), extends across the dielectric spacer 430 to contact the first and second electrodes 420, 440, thereby defining an inter-electrode current path between the first and second electrodes 420, 440 having a path length defined by the width 417 of the dielectric spacer 430. In FIG. 4A, the material for the memory element 410c may include phase change materials with induced compressive stress, as indicated by ">>> <<<". In FIG. 4B, the material for the memory element 410t may include phase change materials with induced tensile stress, as indicated by "<<< >>>". The memory element 410c or 410t may be electrically coupled to and in physical contact with encapsulation materials 432 adjacent to the memory element 410c or 410t, The encapsulation materials may include, for example dielectric materials like $SiO_2$, $Si_3N_4$, $SiO_xN_y$, or $Al_2O_3$, and/or conductive materials like TiN or W or combinations of these and other materials. In operation, as current passes between the first and second electrodes 420, 440 and through the memory element 410c or 410t, the active region 415 heats up more quickly than the remainder of the memory element 410c or 410t.

Figure 5A:
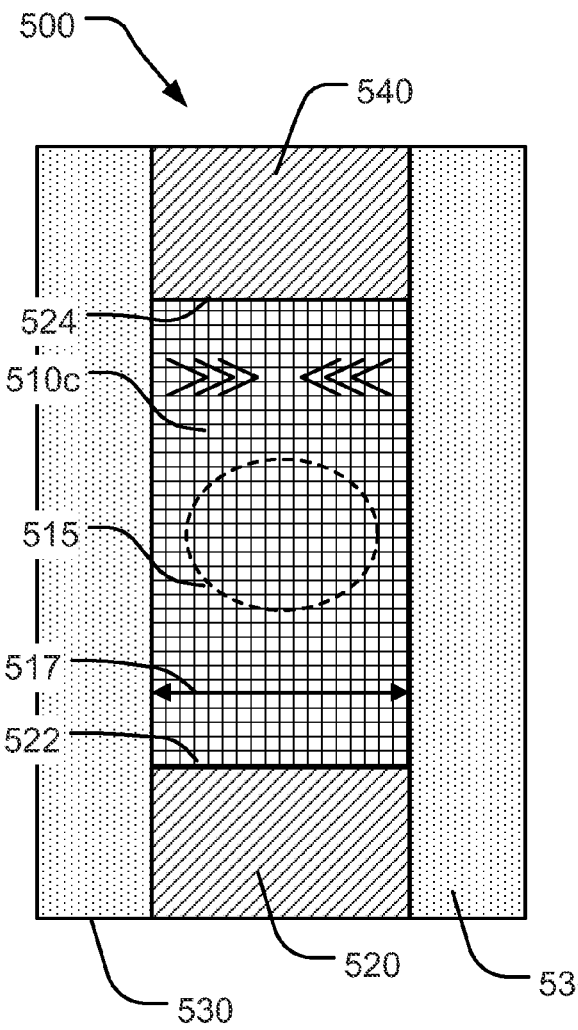
FIGS. 5A-5B illustrate a cross-sectional view of an "active-in-via" type memory cell structure including stressed GST materials.
Figure 5B:
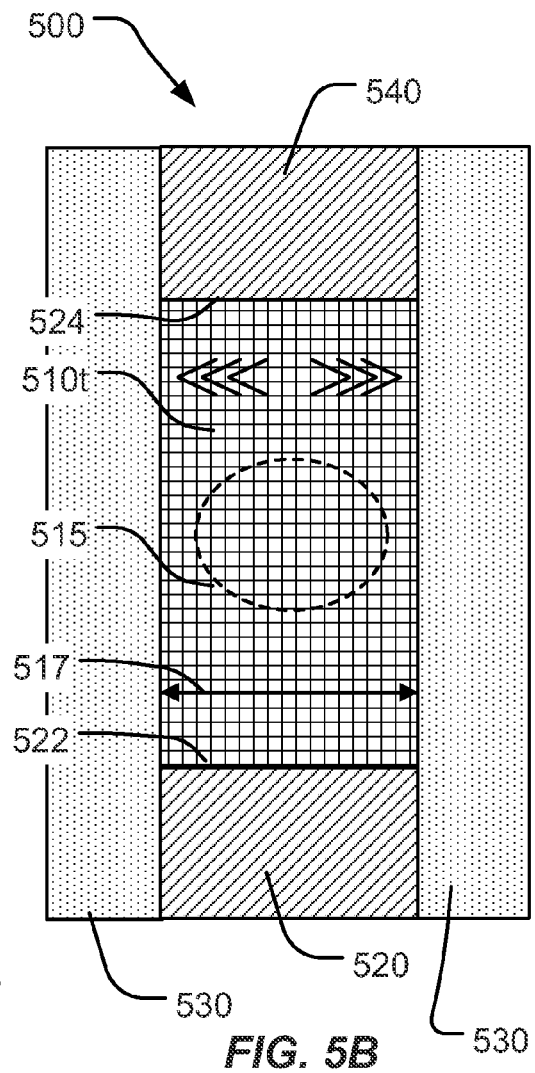

FIGS. 5A and 5B illustrate a cross-sectional view of an "active-in-via" type memory cell structure including GST materials with induced compressive stress or tensile stress, respectively. Memory cell 500 includes a memory element 510*c* or 510*t* contacting first and second electrodes 520, 540 at top and bottom surfaces 522, 524, respectively. Encapsulation materials 530 surround the memory element 510*c* or 510*t*. The memory element 510*c* or 510*t* has a width 517 substantially the same in this example, as that of the first and second electrodes 520, 540 to define a multi-layer pillar surrounded by dielectric (not shown). As used herein, the term "substantially" is intended to accommodate manufacturing tolerances. In FIG. 5A, the material for the memory element 510*c* may include a phase change material with induced compressive stress, as indicated by ">>> <<<". In FIG. 5B, the material for the memory element 510*t* may include a phase change material with induced tensile stress, as indicated by ">>> <<<". The memory element 510*c* or 510*t* may be electrically coupled to and in physical contact with encapsulation materials 530 adjacent to the memory element 510*c* or 510*t*. The encapsulation materials 530 may include, for example dielectric materials like $SiO_2$, $Si_3N_4$, $SiO_xN_y$, or $Al_2O_3$, and/or conductive materials like TiN or W or combinations of these and other materials. In operation, as current passes between the first and second electrodes 520, 540 and through the memory element 510*c* or 510*t*, the active region 515 heats up more quickly than the remainder of the memory element 510*c* or 510*t*.

Figure 6A:
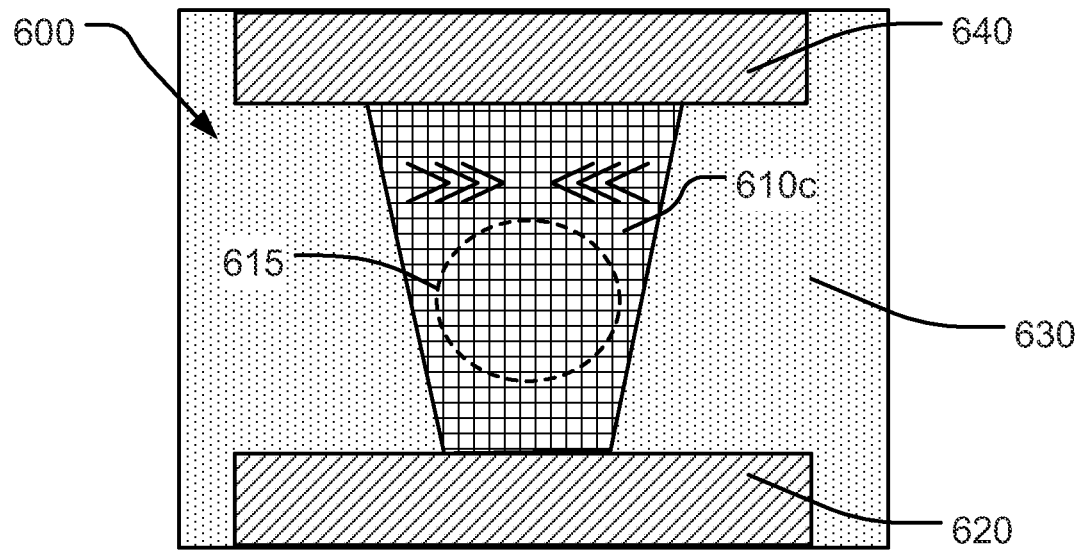
FIGS. 6A-6B illustrate a cross-sectional view of a pore-type memory cell structure including stressed GST materials.
Figure 6B:
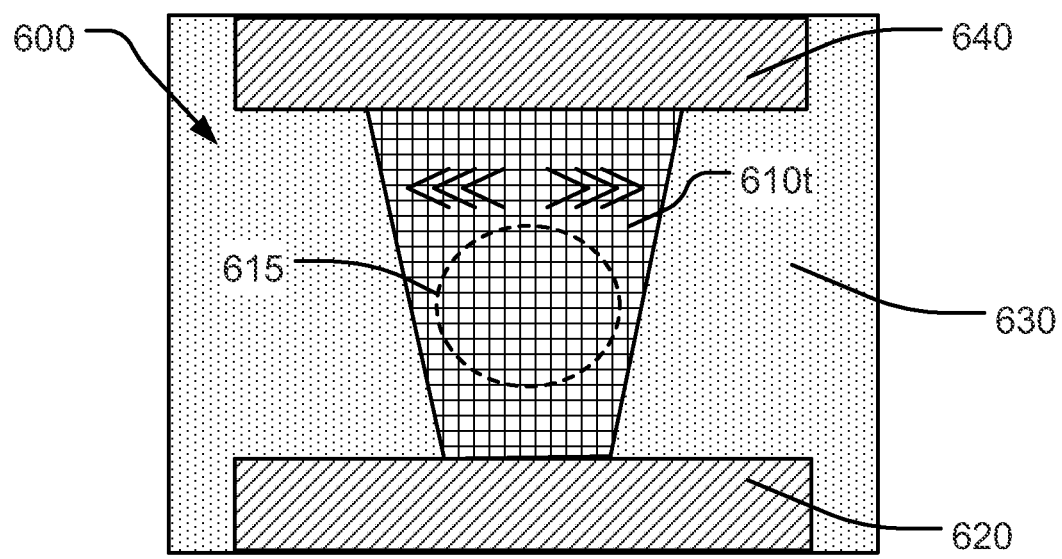

FIGS. 6A and 6B illustrate a cross-sectional view of a pore-type memory cell structure including GST materials with induced compressive stress or tensile stress, respectively. Memory cell 600 includes a memory element 610*c* or 610*t*, Encapsulation materials 630 surround the memory element 610*c* or 610*t*, The pore-type memory element 610*c* or 610*t* is surrounded by dielectric (not shown) contacting first and second electrodes 620, 640 at top and bottom surfaces, respectively. The memory element 610*c* or 610*t* has a width less than that of the first and second electrodes. In FIG. 6A, the material for the memory element 610*c* may include a phase change material with induced compressive stress, as indicated by ">>> <<<". In FIG. 6B, the material for the memory element 610*t* may include a phase change material with induced tensile stress, as indicated by ">>> <<<". The memory element 610*c* or 610*t* may be electrically coupled to and in physical contact with encapsulation materials 630 adjacent to the memory element 610*c* or 610*t*, The encapsulation materials 630 may include, for example, dielectric materials like $SiO_2$, $Si_3N_4$, $SiO_xN_y$ or $Al_2O_3$, and/or conductive materials like TiN or W or combinations of these and other materials. In operation as current passes between the first and second electrodes 620, 640 and through the memory element 610*c* or 610*t*, the active region 615 heats up more quickly than the remainder of the memory element 610*c* or 610*t*.

Figure 7:
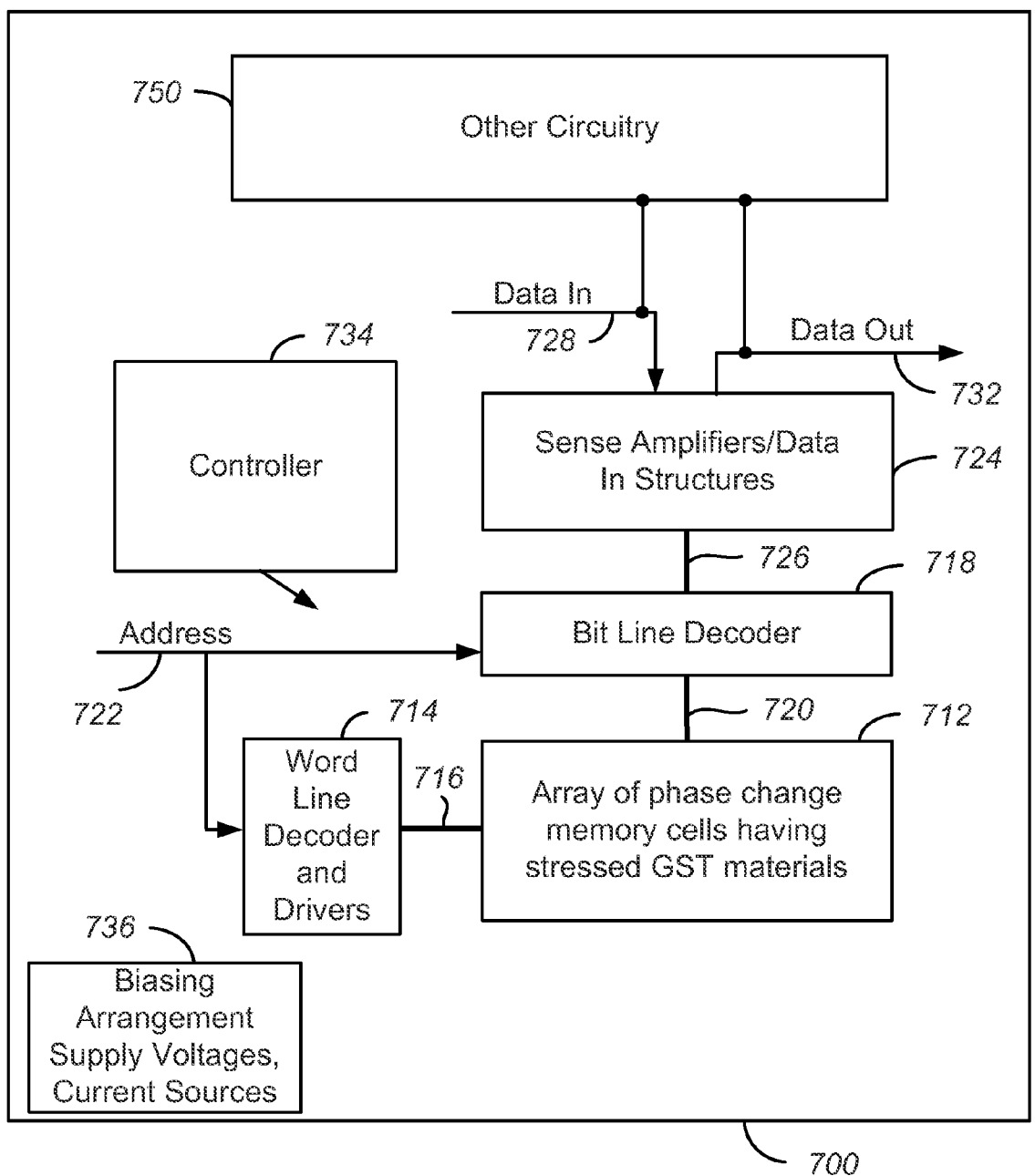
FIG. 7 is a simplified block diagram of a memory device including phase change memory cells having stressed GST materials.

FIG. 7 is a simplified block diagram of a memory device 700 including phase change memory cells having stressed GST materials. The memory device 700 includes a memory array 712 implemented using phase change memory cells with stressed GST materials as described herein. A word line decoder (block 714) is coupled to and in electrical communication with a plurality of word lines 716 arranged along rows in the memory array 712. A bit line (column) decoder 718 is in electrical communication with a plurality of bit lines 720 arranged along columns in the array 712. Addresses are supplied on bus 722 to word line decoder and drivers 714 and bit line decoder 718. Sense amplifiers and data-in structures in block 724 are coupled to bit line decoder 718 via data bus 726. Data is supplied via a data-in line 728 from input/output ports on memory device 700, or from other data sources internal or external to memory device 700, to data-in structures in block 724. Other circuitry 750 may be included on memory device 700, such as a general purpose processor or special purpose application circuitry, or a combination of modules providing system-on-a-chip functionality supported by array 712. Data is supplied via a data-out line 732 from the sense amplifiers in block 724 to input/output ports on memory device 700, or to other data destinations internal or external to memory device 700.

A controller 734 implemented, in this example, using a bias arrangement state machine, controls the application of bias arrangement supply voltages and current sources 736, such as read, set, reset, erase verify and program verify voltages and/or currents. Controller 734 may be implemented using special-purpose logic circuitry as known in the art. In alternative embodiments, controller 734 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 734.

The present invention is not limited to the memory cell structures described herein and generally includes memory cells including a body of phase change material having induced compressive or tensile stress.

Experiments have been conducted on 30 nm and 10 nm GST (Germanium-Antimony-Tellurium) materials to study the effects of compressive stress and tensile stress on re-crystallization speed. GST materials with faster re-crystallization speed in memory cells can lead to improvements on operating speed of integrated circuits including such memory cells.

Figure 8A:
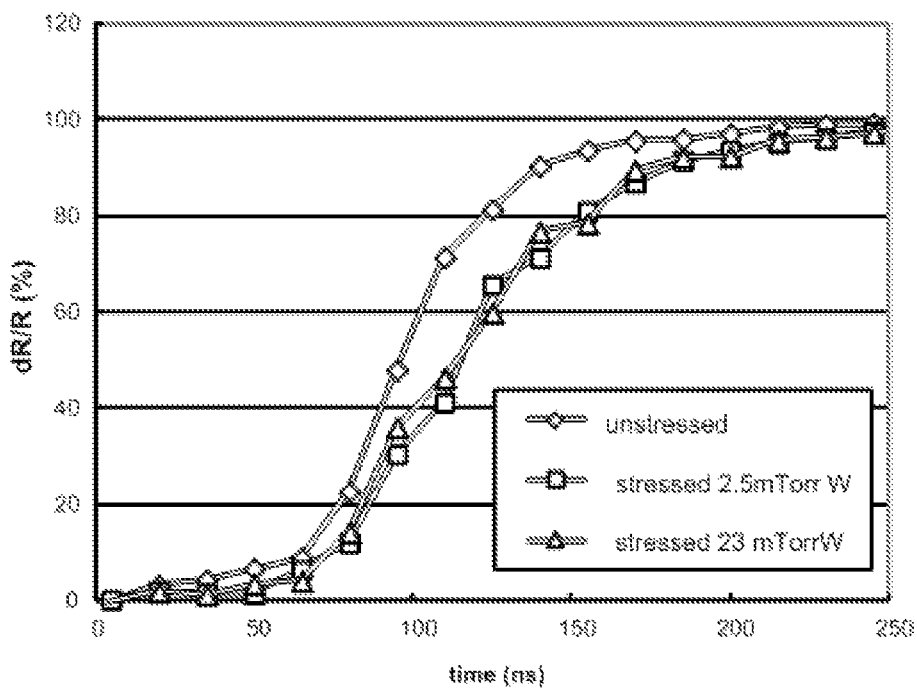
FIG. 8A illustrates crystallization time for as-deposited amorphous 30 nm GST materials.

FIG. 8A illustrates crystallization time for as-deposited amorphous 30 nm GST materials on unstressed and stressed substrates. As shown in FIG. 8A, 90% crystallization is achieved with minimum pulse widths of 140 ns, 185 ns, and 170 ns for substrates that are unstressed, stressed with 2.5 mTorr W (compressive stress), and stressed with 23 mTorr W (tensile stress), respectively. Accordingly, compressive stress and tensile stress on substrates slow down the crystallization of as-deposited amorphous 30 nm GST materials on the substrates by 45 ns and 30 ns, respectively.

Figure 8B:
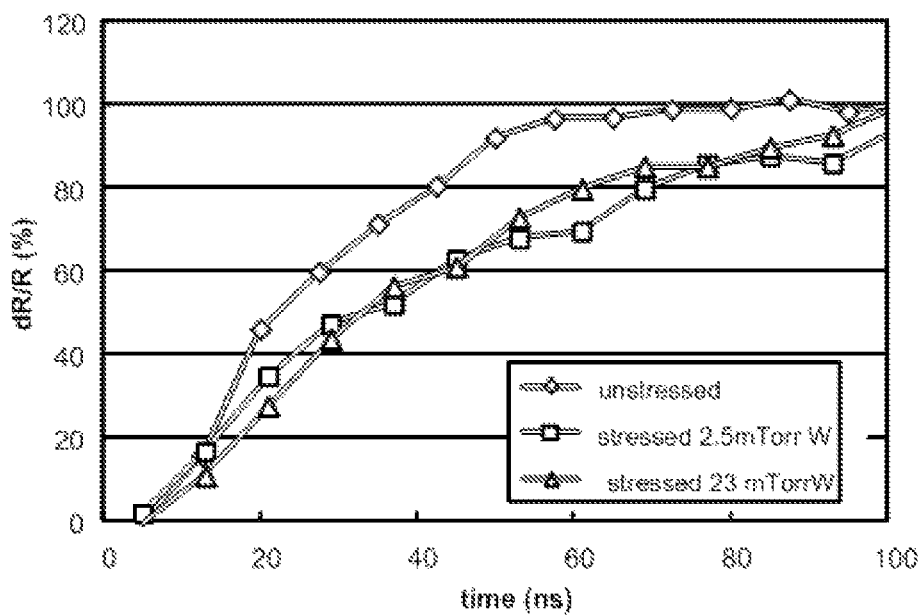
FIG. 8B illustrates re-crystallization time for melt-quenched amorphous 30 nm GST materials.

FIG. 8B illustrates re-crystallization time for melt-quenched amorphous 30 nm GST materials on unstressed and stressed substrates. As shown in FIG. 8B, 90% crystallization is achieved with minimum pulse widths of 50 ns, 97 ns, and 86 ns for substrates that are unstressed, stressed with 2.5 mTorr W (compressive stress), and stressed with 23 mTorr W (tensile stress), respectively. Accordingly, compressive stress and tensile stress on substrates slow down the re-crystallization of melt-quenched amorphous 30 nm GST materials on the substrates by 47 ns and 36 ns, respectively.

Figure 9A:
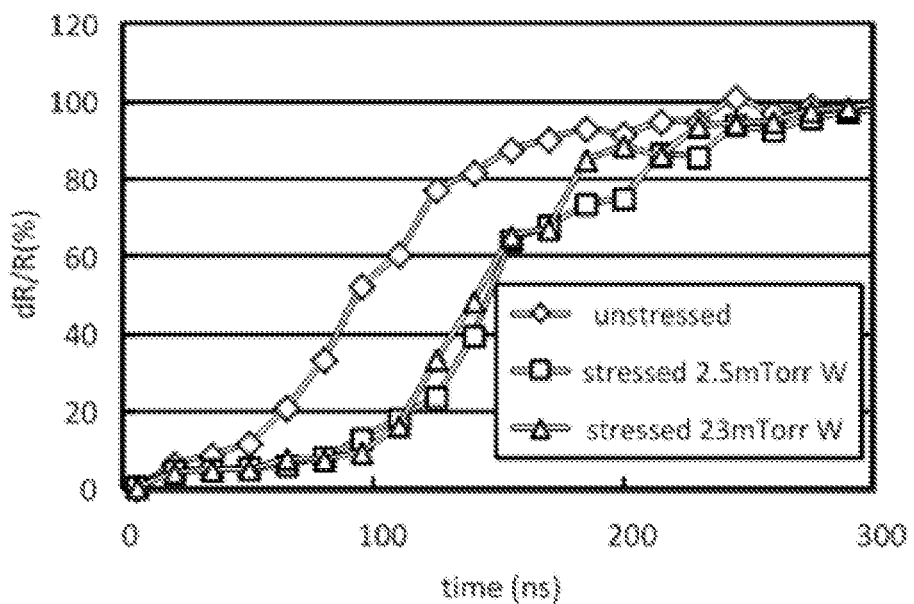
FIG. 9A illustrates crystallization time for as-deposited amorphous 10 nm GST materials.

FIG. 9A illustrates crystallization time for as-deposited amorphous 10 nm GST materials on unstressed and stressed substrates. As shown in FIG. 9A, 90% crystallization is achieved with minimum pulse widths of 170 ns, 237 ns, and 223 ns for substrates that are unstressed, stressed with 2.5 mTorr W (compressive stress), and stressed with 23 mTorr W (tensile stress), respectively. Accordingly, compressive stress and tensile stress on substrates slow down the crystallization of as-deposited amorphous 10 nm GST materials on the substrates by 67 ns and 53 ns, respectively.

Figure 9B:
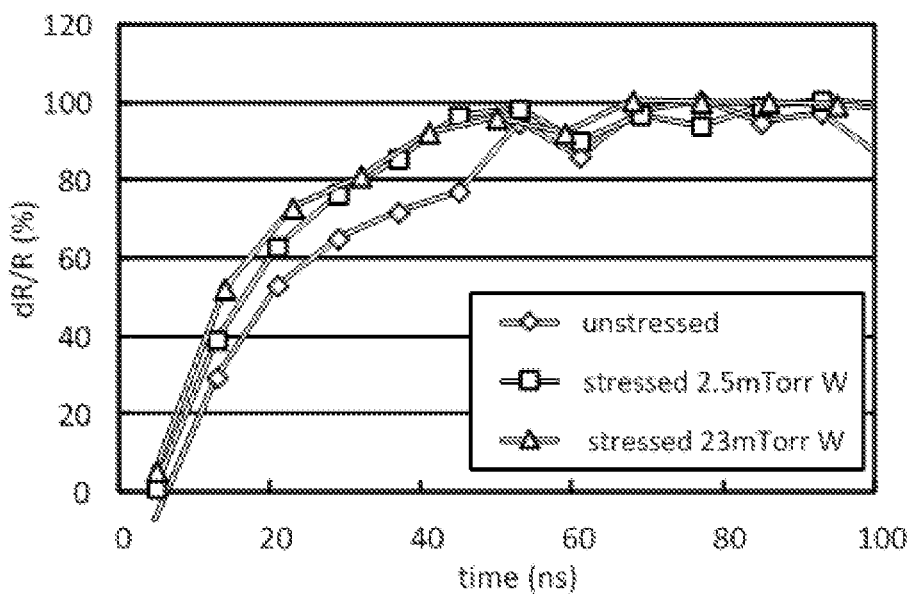
FIG. 9B illustrates re-crystallization time for melt-quenched amorphous 10 nm GST materials.

FIG. 9B illustrates re-crystallization time for melt-quenched amorphous 10 nm GST materials on unstressed and stressed substrates. As shown in FIG. 9B, 90% crystallization is achieved with minimum pulse widths of 52 ns, 41 ns, and 41 ns for substrates that are unstressed, stressed with 2.5 mTorr W (compressive stress), and stressed with 23 mTorr W (tensile stress), respectively. Accordingly, compressive stress and tensile stress on substrates accelerate the re-crystallization of melt-quenched amorphous 10 nm GST materials on the substrates by 11 ns and 11 ns, respectively.

In summary, compressive stress and tensile stress on substrates slow down both the crystallization of as-deposited amorphous 30 nm GST materials on the substrates, and the re-crystallization of melt-quenched amorphous 30 nm GST materials on the substrates. Compressive stress and tensile stress on substrates slow down the crystallization of as-deposited amorphous 10 nm GST materials. However, compressive stress and tensile stress on substrates accelerate the re-crystallization of melt-quenched amorphous 10 nm GST materials on the substrates. GST materials with faster re-crystallization speed in memory cells can accelerate switching speed of memory cells and in turn lead to improvements on operating speed of integrated circuits including such memory cells.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

What is claimed is:

1. A manufacturing method of a memory device, comprising:
   providing a substrate;
   forming memory cells including phase change materials in a layer of encapsulation materials on a front side of the substrate;
   depositing a stress layer on a back side of the substrate prior to said forming memory cells;
   inducing stress into the phase change materials on the front side of the substrate; and
   said inducing includes removing the stress layer after said forming memory cells.

2. The method of claim 1, wherein the stress layer includes a tungsten layer.

3. The method of claim 1, wherein the depositing a stress layer employs a sputtering pressure selected for inducing tensile stress.

4. The method of claim 1, wherein the depositing a stress layer employs a sputtering pressure selected for inducing compressive stress.

5. The method of claim 1, wherein the memory cells comprise a mushroom-type memory cell structure.

6. The method of claim 1, wherein the phase change materials comprise GST ($Ge_xSb_xTe_x$) materials.

7. The method of claim 1, wherein the phase change materials include $Ge_2Sb_2Te_5$.

8. The method of claim 1, wherein the phase change materials have a thickness less than 30 nanometers.

9. The method of claim 1, wherein the phase change materials have a thickness less than or equal to about 10 nanometers.

10. The method of claim 1, wherein the phase change materials have a thickness less than or equal to about 2.5 nanometers.

11. The method of claim 2, wherein the substrate comprises a semiconductor wafer, and the tungsten layer has a thickness approximately ranging between 145 nanometers and 175 nanometers.

12. The method of claim 9, wherein the stressed phase change materials have induced compressive stress.

13. The method of claim 10, wherein the stressed phase change materials have induced compressive stress.

14. The method of claim 10, wherein the stressed phase change materials have induced tensile stress.

* * * * *